(12) United States Patent
Burroughes

(10) Patent No.: US 6,693,611 B1
(45) Date of Patent: Feb. 17, 2004

(54) DISPLAY DEVICES

(75) Inventor: Jeremy Burroughes, Cambridge (GB)

(73) Assignee: Cambridge Display Technology Ltd., Cambridge (GB)

(*) Notice: Subject to any disclaimer, the term of this patent is extended or adjusted under 35 U.S.C. 154(b) by 0 days.

(21) Appl. No.: 09/763,072

(22) PCT Filed: Aug. 17, 1999

(86) PCT No.: PCT/GB99/02719

§ 371 (c)(1),
(2), (4) Date: Apr. 23, 2001

(87) PCT Pub. No.: WO00/11728

PCT Pub. Date: Mar. 2, 2000

(30) Foreign Application Priority Data

Aug. 19, 1998 (GB) ............................................. 9818092

(51) Int. Cl.⁷ ................................................. G09G 3/32
(52) U.S. Cl. ............................. 345/83; 345/84; 345/77; 345/76; 345/72; 345/63
(58) Field of Search ............................. 345/83, 84, 77, 345/76, 72, 63, 600, 603, 694; 315/169.3

(56) References Cited

U.S. PATENT DOCUMENTS

| 4,539,507 A | | 9/1985 | VanSlyke et al. ........... 313/504 |
| 4,800,375 A | * | 1/1989 | Silverstein et al. ......... 345/694 |
| 5,184,114 A | | 2/1993 | Brown ........................ 340/701 |
| 5,724,062 A | | 3/1998 | Hunter ........................ 345/102 |
| 5,795,798 A | | 8/1998 | Mishra et al. ................ 438/35 |

FOREIGN PATENT DOCUMENTS

| EP | 0774787 A2 | 5/1997 |
| GB | 2061587 A | 5/1981 |
| JP | 07175423 A | 7/1995 |
| JP | 10161567 A | 6/1998 |
| JP | 11087062 A | 3/1999 |
| WO | WO 90/13148 A1 | 11/1990 |

* cited by examiner

*Primary Examiner*—Jeffery Brier
*Assistant Examiner*—Tam Tran
(74) *Attorney, Agent, or Firm*—Finnegan, Henderson, Farabow, Garrett & Dunner, LLP

(57) ABSTRACT

A display device comprising an array of light-emissive pixels, each pixel comprising red, green and blue light emitters and at least one further light emitter for emitting a color to which the human eye is more sensitive than the emission color of at least one of the red and blue emitters.

6 Claims, 2 Drawing Sheets

DISPLAY DEVICES

The effect achieved by any type of display is influenced by the sensitivity of the human eye to different colours. FIG. 1 illustrates generally the photoptic curve, which plots the eye's sensitivity across the visible spectrum. Broadly, the human eye is more sensitive to green light and less sensitive to red and blue light. This means that for red, green and blue light emitters to be perceived to be of the same intensity the red and blue emitters must emit more brightly than the green emitter. This generally requires that the red and blue emitters must consume more power than the green emitter.

Most multi-colour display devices comprise an array of pixels, each of which comprises red, green and blue light-emissive zones. The brightness of the light-emissive zones of each pixel are controlled independently by a display controller unit to make each pixel emit a combination of intensities of red, green and blue light that is perceived by a viewer as the desired colour.

Many display devices are used in applications where power consumption is a critical factor. Examples are in battery-powered equipment such as mobile phones and portable computers. In these applications there is a particular drive to reduce the power consumption of the display (as measured in lumens/Watt). However, since extra power is needed to make the red and blue emissions appear to be as intense as the green there is also a need to address the problem that is caused by the eye's relative insensitivity to some colours Numerous technologies are available for constructing display devices, and all face this problem.

One specific class of display devices is those that use an organic material for light emission. Light-emissive organic materials are described in PCT/WO90/13148 and U.S. Pat. No. 4,539,507, the contents of both of which are incorporated herein by reference. The basic structure of these devices is a light-emissive organic layer, for instance a film of a poly(p-phenylenevinylene) ("PPV"), sandwiched between two electrodes. One of the electrodes (the cathode) injects negative charge carriers (electrons) and the other electrode (the anode) injects positive charge carriers (holes). The electrons and holes combine in the organic layer generating photons. In PCT/WO90/13148 the organic light-emissive material is a polymer. In U.S. Pat. No. 4,539,507 the organic light-emissive material is of the class known as small molecule materials, such as (8-hydroxyquinolino) aluminium ("Alq3"). In a practical device, one of the electrodes is typically transparent, to allow the photons to escape the device.

FIG. 2 shows the typical cross-sectional structure of an organic light-emissive device ("OLED"). The OLED is typically fabricated on a glass or plastic substrate 1 coated with a transparent first electrode 2 such as indium-tin-oxide ("ITO"). Such coated substrates are commercially available. This ITO-coated substrate is covered with at least a layer of a thin film of an electroluminescent organic material 3 and a final layer forming a second electrode 4, which is typically a metal or alloy. Other layers can be added to the device, for example to improve charge transport between the electrodes and the electroluminescent material.

According to the present invention there is provided a display device comprising an array of light-emissive pixels, each pixel comprising red, green and blue light emitters and at least one further light emitter for emitting a colour to which the human eye is more sensitive than the emission colour of at least one of the red and blue emitters.

There may suitably be one or more further light emitters in addition to the one mentioned above, for emitting additional colours to which the human eye is more sensitive than the emission colour of at least one of the red and blue emitters.

Where the emission colour of any of the further light emitters lies between the emission colours of the red and green emitters then the emission colour of that further light emitter is preferably one to which the human eye is more sensitive than to the emission colour of the red emitter. Where the emission colour of any of the further light emitters lies between the emission colours of the blue and green emitters then the emission colour of that further light emitter is preferably one to which the human eye is more sensitive than. to the emission colour of the blue emitter.

Preferably the emission colour of at least one of the further emitters lies between those of the red and green emitters and the emission colour of at least another one of the further emitters lies between those of the green and blue emitters. In one preferred configuration there are five emitters: the red, green and blue emitters and two further emitters, one having an emission colour that lies spectrally between those of the red and the green emitters (for example an orange emitter) and one having an emission colour that lies between those of the green and blue emitters (for example a light blue emitter).

The display device preferably comprises a display controller for controlling emission from the display. The display controller may suitably receive a signal defining a desired visual output. In response to that signal the display controller may suitably control the brightness of each light emitter of each pixel of the display so as to cause the pixel to be perceptible by a viewer as emitting an appropriate colour. By this means, preferably the pixels in combination display the desired visual output.

The display controller preferably controls the light emitters so as to improve the power efficiency of the display device and/or to minimise (or substantially minimise) the power consumed by each pixel in order to display the desired colour. To achieve this it may control the further emitters to emit in preference to the red and/or blue emitters. This may not be appropriate for some emission colours, so where the colour to be displayed by a pixel cannot be produced without use of the red and/or blue emitters then emission from one or both of the red and blue emitters will be used.

Preferably each light emitter is independently controllable by the display controller. This may be by means of an active matrix addressing scheme, in which case there is preferably thin film active matrix circuitry in the display device, or less preferably by means of a passive matrix addressing scheme.

Each light emitter may use an organic or an inorganic material for light emission. Suitably each light emitter comprises light-emissive organic material, such as light-emissive semiconductive polymer material.

Different materials may be used to generate each emission colour.

The blue light emitter is preferably a deep blue light emitter. The red light emitter is preferably a deep red light emitter. Examples of suitable colours for the blue and red emitters are around x=0.15, y=0.05 and x=0.63, y=0.33 in the 1931CIE scheme.

The structure of the display device may be such that each light emitter comprises a region of light-emissive material. On either side of that region there may be a charge carrier injection layer or electrode. At least one of the electrodes is preferably light transitive, The electrodes may be linear. One electrode may make contact with more than one light emitter. The device may be substantially planar. The electrodes on both. faces of the device may be linear. The electrodes on one face of the device may be orthogonal to those on those other face of the device. There may be one or more charge transport layers located between the electrodes and the light-emissive material.

Some preferred materials for components (where present) of the display device are as follows:

One of the electrodes (the hole-injecting electrode) preferably has a work function of greater than 4.3 eV. That layer may comprise a metallic oxide such as indium-tin oxide ("ITO") or tin oxide ("TO") or a high work function metal such as Au or Pt. The other electrode (the electron-injecting electrode) preferably has a work function less than 3.5 eV. That layer may suitably be made of a metal with a low work function (Ca, Ba, Yb, Sm, Li etc.) or an alloy or multi-layer structure comprising one or more of such metals together optionally with other metals (e.g. Al). At least one of the electrode layers is suitably light transmissive, and preferably transparent, suitably at the frequency of light emission from one or more of the light-emissive regions.

The or each charge transport layer may suitably comprise one or more polymers such as polystyrene sulphonic acid doped polyethylene dioxythiophene ("PEDOT-PSS"), poly (2,7-(9,9-di-n-octylfluorene)-(1,4-phenylene-(4-imino (benzoic acid))-1,4-phenylene-(4-imino(benzoic acid))-1,4-phenylene)) ("BFA"), polyaniline and PPV.

The or each organic light-emissive material may comprise one or more individual organic materials, suitably polymers, preferably fully or partially conjugated polymers. Suitable materials include one or more of the following in any combination: poly(p-phenylenevinylene) ("PPV"), poly (2-methoxy-5(2'-ethyl)hexyloxyphenylenevinylene) ("MEH-PPV"), one or more PPV-derivatives (e.g. di-alkoxy or di-alkyl derivatives), polyfluorenes and/or co-polymers incorporating polyfluorene segments, PPVs and related co-polymers, poly(2,7-(9,9-di-n-octylfluorene)-(1,4-phenylene-((4-secbutylphenyl)imino)-1,4-phenylene)) ("TFB"), poly(2,7-(9,9-di-n-octylfluorene)-(1,4-phenylene-((4-methylphenyl)imino)-1,4-phenylene-((4-methylphenyl) imino)-1,4-phenylene)) ("PFM"), poly(2,7-(9,9-di-n-octylfluorene)-1,4-phenylene-((4-methoxyphenyl)imino)-1,4-phenylene-((4-methoxyphenyl)imino)-1,4-phenylene)) ("PFMO"), poly (2,7-(9,9-di-n-octylfluorene) ("F8") or (2,7-(9,9-di-n-octylfluorene)-3,6-Benzothiadiazole) ("F8BT"). Alternative materials include small molecule materials such as Alq3.

According to a second aspect of the present invention there is provided an electronic device comprising a display device as described above.

The present invention will now be described by way of example with reference to the accompanying drawings, in which.

Figure 1:
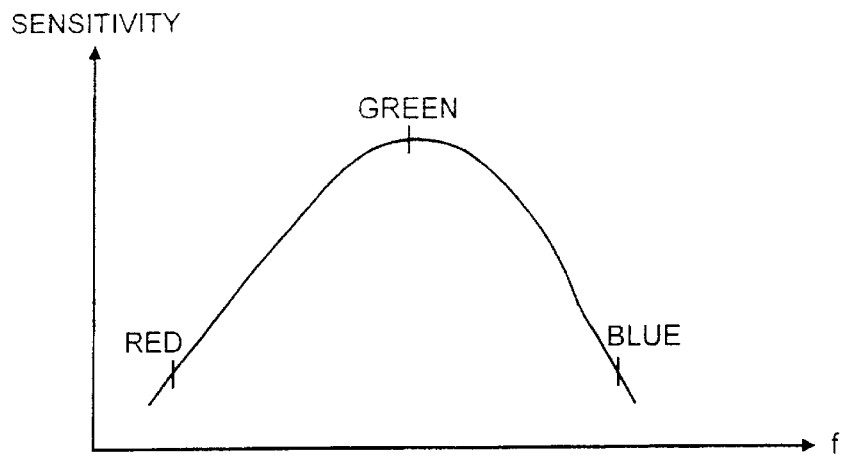
FIG. 1 is a plot of eye sensitivity across the visible spectrum, illustrating generally the photoptic curve.
Figure 2:
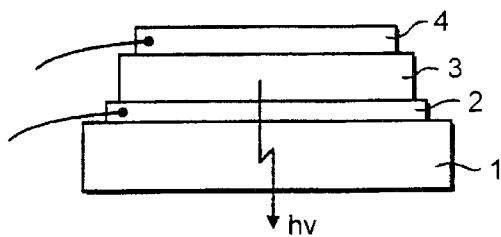
FIG. 2 is a schematic diagram of a typical cross-section of an organic light-emissive device.
Figure 3:
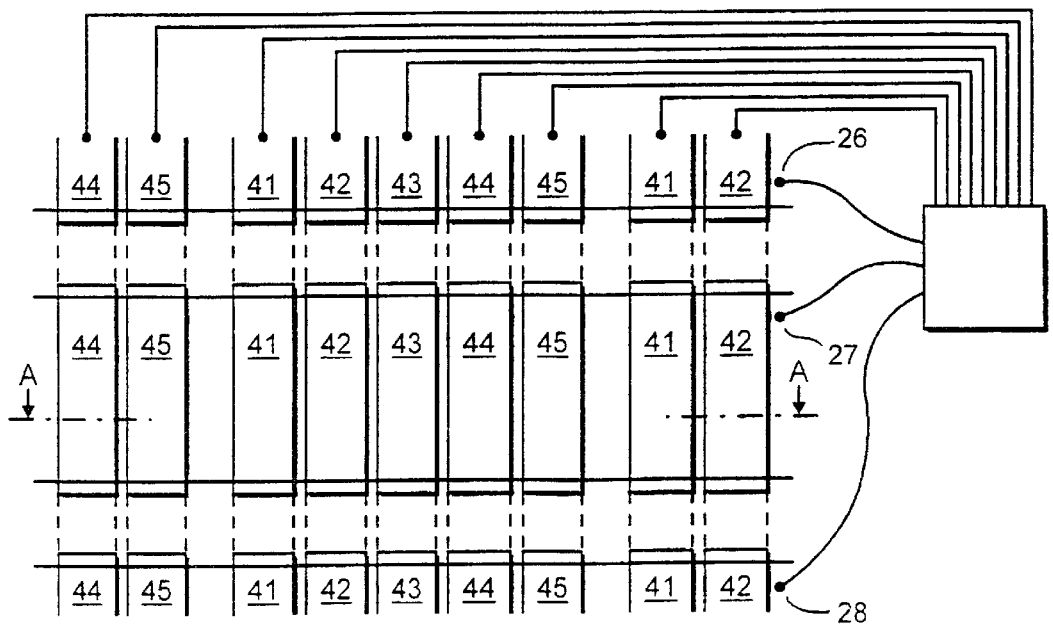
FIG. 3 shows a schematic plan view of part of a display device.
Figure 4:
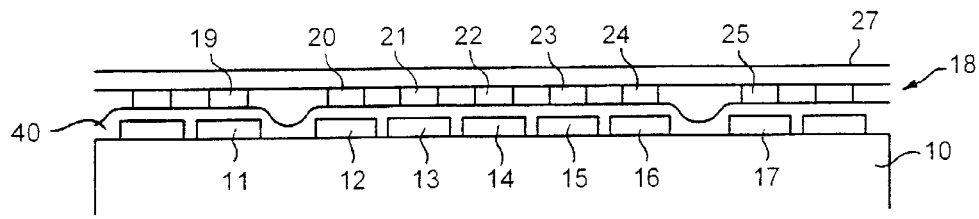
FIG. 4 shows a schematic cross-sectional view of part of the display device on the line A–A' in FIG. 4.

The device of FIGS. 3 and 4 is an organic light-emissive device in which each pixel comprises five adjacent light-emissive zones, each of which has a different emission colour. Zone 41 of each pixel emits red light, zone 42 emits red-orange light, zone 43 emits green light, zone 44 emits blue-white light and zone 45 emits blue light. Thus, the zones 41, 43 and 45 are analogous to the red, green and blue emissive zones in a conventional device, but in addition there is the zone 42, whose emission colour lies between those of zones 41 and 43 and in a more responsive zone of the photoptic curve than zone 41, and the zone 44, whose emission colour lies between those of zones 43 and 45 and in a more sensitive zone of the photoptic curve than zone 45. The zones can be controlled independently by a display controller 50. The display controller can use emission from the zones 42 and 44 instead of (or in addition to) emission from the zones 41 and 45 respectively in order to generate colours with greater power efficiency.

Figure 5:
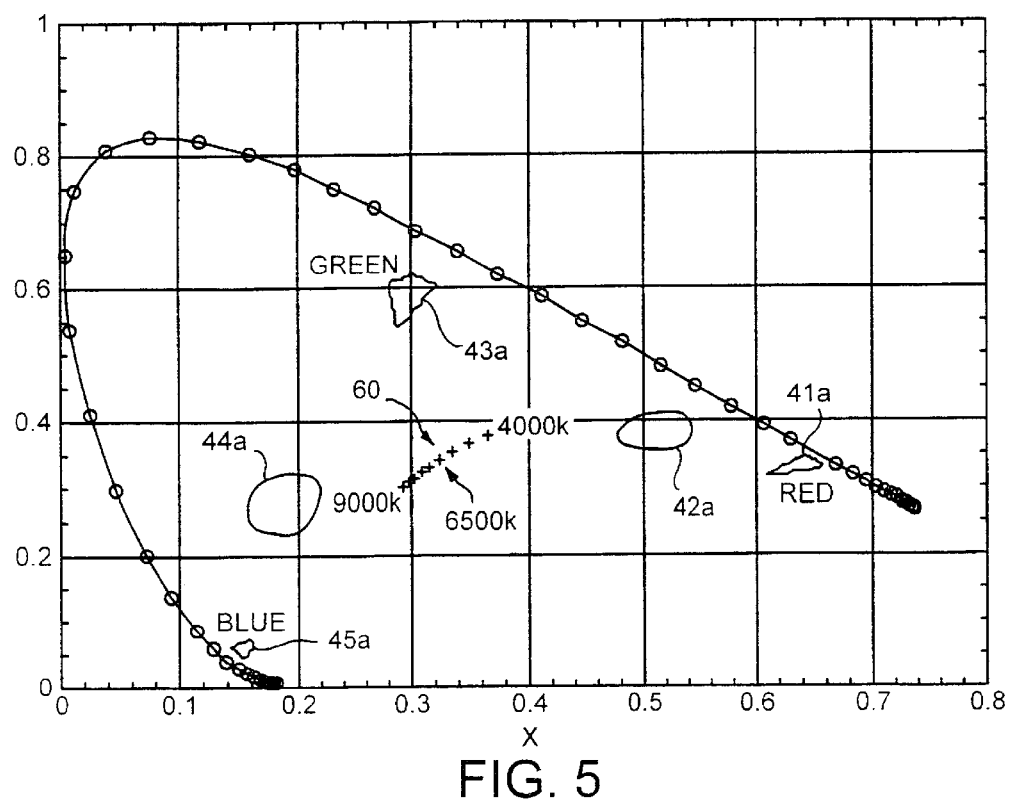
FIG. 5 shows a 1931 CIE chromaticity diagram showing examples of the emission colours from zones of the display.

FIG. 5 shows in the form of a 1931 CIE chromaticity diagram example emission colours of the zones of the display. The red colour of zone 41 is indicated at 41a, the red-orange colour of zone 42 is indicated at 42a, the green colour of zone 43 is indicated at 43a, the blue-white colour of zone 44 is indicated at 44a and the blue colour of zone 45 is indicated at 45a. Standard white colours are indicated generally at 60. It is preferred that the emission colours of the zones 42 and 44 should be selected such that white colours can be produced by a combination of the emission colours of the zones 42, 43 and 44. To produce better white colours (by means of emission over a broader range of frequencies) the zones 42 and 44 could emit over a broader band than typical red, green or blue emitters. As a specific example, the emission from one or both of the zones 42 and 44 could be over a broader band than that from one, two or all three of the zones 41, 43 and 45, at least as regards the frequencies at which there is substantial emission.

The display device of FIGS. 3 and 4 will now be described in more detail.

FIG. 3 shows a plan view of part of the device. The device is generally planar, and comprises numerous pixels arranged in an orthogonal array of rows and columns. Only one of the pixels is shown fully in the figures.

FIG. 4 shows a cross section through part of the device. The device includes a transparent layer 10 which provides the front of the device in use. This transparent layer could, for example, be formed of glass or plastics material.

Behind the transparent layer 10 is a series of parallel row electrodes 11–17 formed of a transparent conductive material such as ITO. The row electrodes are spaced apart so that each one is electrically isolated from the others. Each of the row electrodes is connected independently to the display controller 50.

Behind the row electrodes is a charge transport layer 40 formed, for example, of polystyrene sulphonic acid doped polyethylene dioxythiophene (PEDOT-PSS). This assists the transport of charge from the electrodes 11–17 to light-emissive regions 19–25 and presents a barrier to charge flow in the opposite direction, improving the conditions for charge recombination in the light-emissive regions.

Behind the charge transport layer is a light-emissive layer indicated generally as 18. The light-emissive layer is divided into separate regions 19–25 that can emit light of different colours. Regions 19 and 24 can emit blue light, regions 20 and 25 can emit red light, region 21 can emit red-orange light, region 22 can emit green light and region 23 can emit blue-white light. Examples of suitable materials for the regions 19–25 are as follows:

19 & 24: polyfluorene (F8) in poly-dioctylphenylenethiophene (DOPT);

20 & 25: cyano-PPV/TFB;

21: MEH-cyano PPV/TFB/F8;

22: TFB/5F8BT;
23: PFMO/TFB/F8.
(5F8BT refers to F8 doped with 5% F8BT.)

Behind the light-emissive layer is a series of parallel column electrodes 26–28 formed, for example, from an 80 nm thick layer of calcium adjacent the light-emissive layers followed by a 200 nm thick layer of aluminium. The column electrodes are orthogonal to the row electrodes. The column electrodes are spaced apart so that each one is electrically isolated from the others. Each of the column electrodes is independently connected to the display controller 50.

Each light-emissive region is located between one pairing of row and column electrodes, and can therefore be-addressed by the display controller 50 using a passive matrix addressing scheme. In a passive matrix addressing scheme the display controller applies a relatively high voltage to each of the row lines in turn. As the high voltage is applied to each row electrode the controller applies lower voltages to the column electrodes. Those lower voltages are set so as to cause emission of the desired intensity from the light-emissive regions at the intersection of the row electrode and the respective column electrode. After a brief period of emission from selected light-emissive regions of that row, the next row electrode is addressed and appropriate voltages are again applied to the column electrodes. When all the row electrodes have been addressed in this way the process is repeated.

The display controller receives a display data signal at 29 that defines the image to be displayed by the display device. The display data signal could, for example, be received from the display output of a computer or from a television signal decoder or from the microprocessor of a phone. In the display controller a decoding unit 30 decodes the display data signal to determine the emission colours that are required from each pixel in order to display the image defined by the display data signal. These colours are passed to colour separating unit 31 which determines, using a process that will be described in more detail below, the intensities that are required from the five light-emissive regions of the pixel in order to generate that colour. These intensities are stored for each emissive region in memory 31. Display driver 32 has access to the memory 31. Display driver 32 scans the row lines and applies appropriate voltages to the column lines in a passive matrix addressing scheme to cause each light-emissive region to emit with the desired intensity. In this way each pixel is driven so that a viewer perceives the desired emission colour.

The process employed by the separating unit 31 aims to reduce the power consumption of the display in comparison to conventional red/green/blue displays by using emission from the light-emissive zones 2 and 4 in preference to emission from the light-emissive zones 1 and 5. Since the eye is more sensitive to the emission colours of zones 2 and 4 than to those of zones 1 and 5 this allows the power consumption of the display to be reduced. Of course, it is necessary to use the zones 1 and 5 to generate colours that cannot be produced by a combination of the emission colours of the zones 2, 3 and 4. The exact weightings of the emission from zone 1 relative to zone 2 and from zone 4 relative to zone 5 can easily be determined by experimentation to minimise power consumption for any particular type of device. However, one preferred solution is to avoid the use of emissions from zones 1 and 5 unless they are essential to generate the desired colour. In many applications, computer displays often display large white or off-white areas. Instead of using emission from zones 1, 3 and 5 together to achieve a white colour the device of FIG. 3 could use emission from zones 2, 3 and 4 together to give a substantial increase in power efficiency.

Too manufacture the device a commercially available sheet of ITO-coated glass is cleaned and then patterned to produce the row electrodes. The regions of light-emissive material are then deposited over the row electrodes, for example by ink jetting of the light-emissive polymer materials in their locations. Finally the cathode is deposited by evaporation first of calcium and then of aluminium, and the device is encapsulated by sealing within a glass/epoxy encapsulant.

Some variants of the device described above will now be described.

The electrodes could be reversed, so that the column electrodes lie in front of the light-emissive material and the row electrodes behind it and/or so that the column electrodes are the anodes and the row electrodes are the cathodes.

The passive matrix scheme could scan the columns instead of the rows. Instead of a passive matrix addressing scheme another scheme, such as an active matrix addressing scheme, could be used. This could be arranged by providing thin-film transistor (TFT) circuitry in the display panel.

The shapes, areas and thicknesses of the emissive material in the zones 1–5 could be the same or could be different, so as to optimise the power efficiency of the device. The light-emissive regions could be arranged on top of, instead of beside, one another, provided the material of overlying regions did not damage the performance of the device by absorbing light emitted from underlying layers.

A charge transport layer could be provided between one or more of the light-emissive regions and either or both electrodes. The charge transport layer could improve charge transport from the electrode to the light-emissive region and/or resist the passage of charge in the opposite direction.

The device could use a different technology for light emission: for example it could use inorganic material for light emission.

The present invention may include any feature or combination of features disclosed herein either implicitly or explicitly or any generalisation thereof, irrespective of whether it relates to the presently claimed invention. In view of the foregoing description it will be evident to a person skilled in the art that various modifications may be made within the scope of the invention.

What is claimed is:

1. A display device comprising an array of light-emissive pixels, each pixel comprising:

red, green and blue light emitters;

at least one further light emitter for emitting a colour that lies spectrally between the emission colours of the red and green emitters and is a colour to which the human eye is more sensitive than the emission colour of the red emitter; and/or a second further light emitter for emitting a colour that lies spectrally between the emission colours of the blue and green emitters and is a colour to which the human eye is more sensitive than the emission colour of the blue emitter;

the display device further comprising:

a display controller for receiving a signal defining a desired visual output and controlling the brightness of each light emitter to cause the array of pixels to display that visual output wherein the display controller controls the at least one further light emitter preferentially to the red light emitter and/or controls the second further light emitter preferentially to the blue light emitter so as to substantially maximize the power efficiency of the display device.

2. A display device as claimed in claim 1, wherein each light emitter is independently controllable by the display controller.

3. A display device as claimed in claim 1, wherein each light emitter comprises light-emissive organic material.

4. A display device as claimed in claim 3, wherein the light-emissive organic material is semiconductive polymer material.

5. A display device as claimed in claim 3, wherein each type of light emitter comprises a respective light-emissive organic material.

6. An electronic device comprising a display device as claimed in claim 1.

* * * * *